(12) United States Patent
Ewen

(10) Patent No.: US 7,888,998 B1
(45) Date of Patent: Feb. 15, 2011

(54) LOW-VOLTAGE CMOS ERROR AMPLIFIER WITH IMPLICIT REFERENCE

(75) Inventor: John F. Ewen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/564,570

(22) Filed: Sep. 22, 2009

(51) Int. Cl.
*H03F 3/00* (2006.01)

(52) U.S. Cl. .................... 330/11; 330/199; 330/127; 330/296; 330/297

(58) Field of Classification Search ............... 330/11, 330/199, 127, 296, 297
See application file for complete search history.

(56) References Cited

U.S. PATENT DOCUMENTS

| | | | |
|---|---|---|---|
| 6,025,754 A * | 2/2000 | Czora | 330/296 |
| 6,788,151 B2 * | 9/2004 | Shvarts et al. | 330/297 |
| 6,819,166 B1 | 11/2004 | Choi et al. | |
| 6,836,187 B2 * | 12/2004 | Jansen et al. | 330/279 |
| 7,091,783 B2 | 8/2006 | Bailey et al. | |
| 7,224,228 B2 * | 5/2007 | Takahashi et al. | 330/279 |
| 7,315,152 B1 * | 1/2008 | Epperson et al. | 323/271 |
| 7,499,682 B2 * | 3/2009 | Rozenblit et al. | 455/127.3 |
| 2006/0028271 A1 | 2/2006 | Wilson | |

* cited by examiner

*Primary Examiner*—Patricia Nguyen
(74) *Attorney, Agent, or Firm*—Yee & Associates, P.C.; Ian D. MacKinnon

(57) ABSTRACT

An analog error amplifier includes an amplifier circuit and a replica bias circuit that together produce an output signal representing a difference between an input signal and a reference signal. The amplifier circuit produces the output signal in response to the input signal and a bias signal provided by the replica bias circuit. The bias signal may establish a reference threshold of a basic amplifier in the amplifier circuit. The replica bias circuit produces the bias signal in response to the reference signal and drives the bias signal to be equal to the reference signal. The replica bias circuit may include a plurality of amplifier stages. The bias signal produced by a single replica bias circuit may be provided to a plurality of amplifier circuits to provide a plurality of error amplifiers for a single reference signal.

20 Claims, 5 Drawing Sheets

* # LOW-VOLTAGE CMOS ERROR AMPLIFIER WITH IMPLICIT REFERENCE

BACKGROUND

1. Field

The disclosure relates generally to analog error amplifier circuits, and more specifically to an analog error amplifier using complementary metal-oxide-semiconductor (CMOS) technology and adapted for use at low supply voltages.

2. Description of the Related Art

Many applications require a low-frequency analog error amplifier having an output that represents the difference between an input signal and a reference voltage or current. Typically error amplifiers are implemented using differential amplifiers comprised of an input differential pair, a tail current source, and resistive or active devices as loads.

BRIEF SUMMARY

An analog error amplifier adapted for use at low supply voltages is disclosed. In accordance with an illustrative embodiment, the error amplifier includes an amplifier circuit and a replica bias circuit. The amplifier circuit and the replica bias circuit together produce an output signal in response to an input signal and a reference signal such that the output signal represents a difference between the input signal and the reference signal.

The amplifier circuit includes an input signal input, a bias signal input, and an output signal output. The amplifier circuit produces an output signal on the output signal output in response to the input signal on the input signal input and a bias signal on the bias signal input such that the output signal represents a difference between the input signal and the bias signal. In an illustrative embodiment, the amplifier circuit includes a basic amplifier. The basic amplifier produces the output signal on the output signal output in response to the input signal on the input signal input. A reference threshold of the basic amplifier is responsive to the bias signal on the bias signal input such that the output signal represents a difference between the input signal and the bias signal.

The replica bias circuit includes a reference signal input and a bias signal output. The replica bias circuit produces the bias signal on the bias signal output in response to the reference signal on the reference signal input and drives the bias signal to be equal to the reference signal. In an illustrative embodiment, the replica bias circuit includes a plurality of basic amplifier stages connected in series between the reference signal input and the bias signal output. The bias signal output is connected in a feedback loop to the plurality of amplifier stages such that the replica bias circuit produces the bias signal on the bias signal output in response to the reference signal on the reference signal input and drives the bias signal to be equal to the reference signal.

The bias signal output of the replica bias circuit is connected to the bias signal input of the amplifier circuit to provide the bias signal produced by the replica bias circuit to the amplifier circuit. Thus, the amplifier circuit and replica bias circuit together produce the output signal in response to the input signal and the reference signal such that the output signal represents a difference between the input signal and the reference signal.

In an illustrative embodiment, the bias signal output of a single replica bias circuit is connected to the bias signal input of each of a plurality of amplifier circuits, such that each of the plurality of amplifier circuits produces an output signal in response to the input signal to the amplifier circuit and the reference signal to the single replica bias circuit such that the output signal of each amplifier circuit represents a difference between the input signal and the reference signal.

Further objects, features, and advantages will be apparent from the following detailed description and with reference to the accompanying drawings

DETAILED DESCRIPTION

Figure 1:
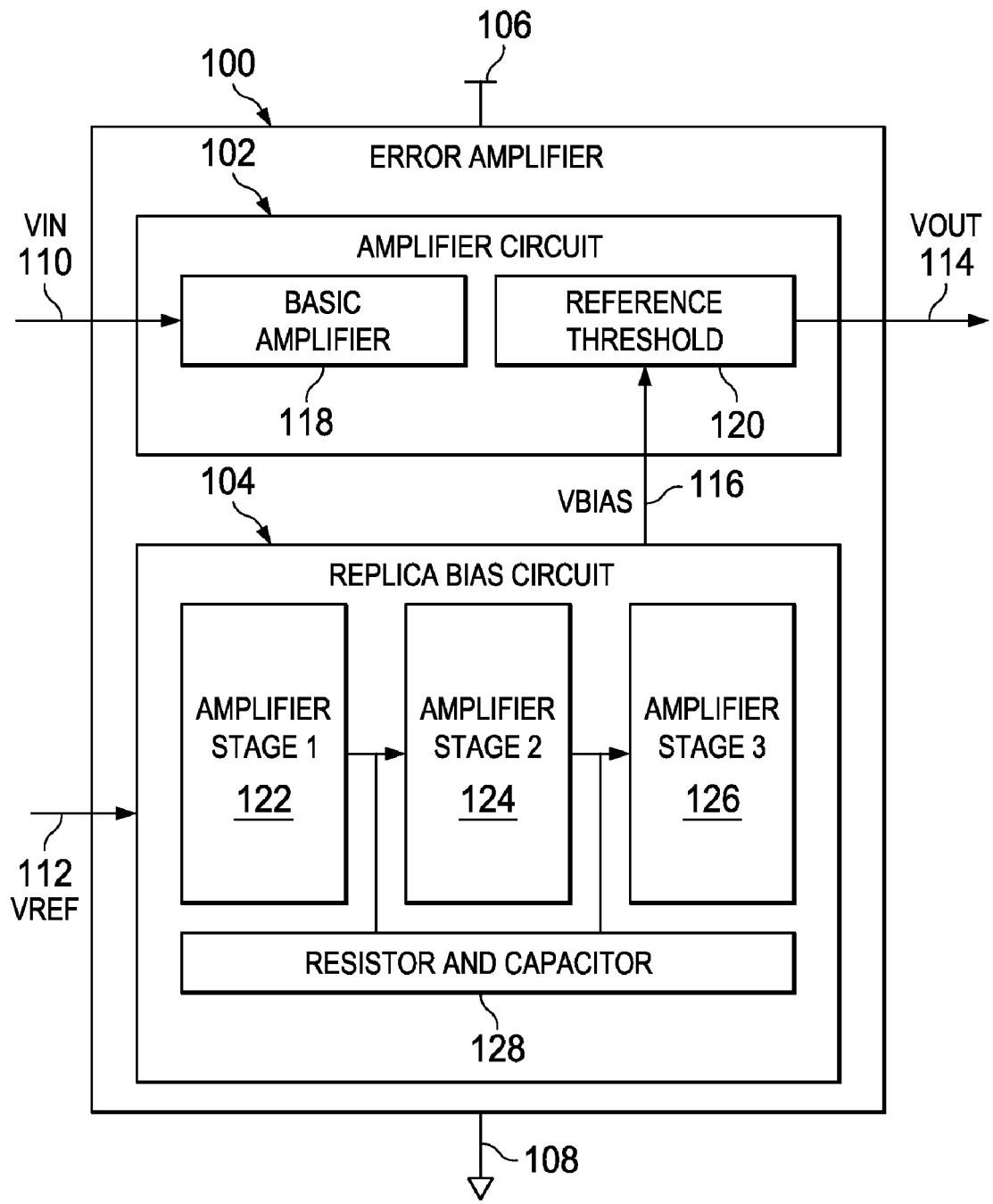
FIG. 1 is a block diagram of functional components of an exemplary error amplifier in accordance with an illustrative embodiment.

As supply voltages decrease, it becomes increasingly difficult to implement a differential amplifier with sufficient voltage headroom across all devices to maintain performance. A need therefore exists for an error amplifier that can be used in low voltage applications where it may be difficult or impossible to implement an error amplifier in a conventional manner using a typical differential amplifier design.

An analog error amplifier adapted for use at low supply voltages is disclosed. The basic structure of an exemplary error amplifier 100 in accordance with an illustrative embodiment is presented in block diagram form in FIG. 1. In accordance with an illustrative embodiment, error amplifier 100 includes amplifier circuit 102 and replica bias circuit 104. In addition to conventional supply voltage 106 and ground 108 connections, error amplifier 100 includes input signal input 110, reference signal input 112, and output signal output 114. In accordance with an illustrative embodiment, amplifier circuit 102 and replica bias circuit 104 together produce an output signal on output signal output 114 in response to an input signal on input signal input 110 and a reference signal on reference signal input 112 such that the output signal represents a difference between the input signal and the reference signal.

Amplifier circuit 102 is connected to input signal input 110 and output signal output 114. Amplifier circuit 102 also is connected to replica bias circuit 104 via bias signal input 116. Amplifier circuit 102 produces an output signal on output signal output 114 in response to the input signal on input signal input 110 and a bias signal on bias signal input 116 such that the output signal represents a difference between the input signal and the bias signal. In accordance with an illustrative embodiment, amplifier circuit 102 includes basic amplifier 118 and additional components that are used to control a reference threshold 120 of basic amplifier 118. Basic amplifier 118 produces the output signal on output signal output 114 in response to the input signal on input signal input 110. Reference threshold 120 of basic amplifier 118 is responsive to the bias signal on bias signal input 116 such that the output signal represents a difference between the input signal and the bias signal.

Replica bias circuit 104 is connected to reference signal input 112 and to bias signal input 116 to amplifier circuit 102. Replica bias circuit 104 produces the bias signal on bias signal input 116 in response to the reference signal on reference signal input 112 and drives the bias signal to be equal to the reference signal. In an illustrative embodiment, replica bias circuit 104 includes a plurality of amplifier stages 122, 124, and 126 connected in series between reference signal input 112 and bias signal output 116. Replica bias circuit 104 may also include a resistor and capacitor circuit 128 connected to compensate amplifier stages 122, 124, and 126 and to ensure overall stability. Within replica bias circuit 104, bias signal output 116 is connected in a feedback loop to amplifier stages 122, 124, and 126 such that replica bias circuit 104 produces the bias signal on bias signal output 116 in response to the reference signal on reference signal input 112 and drives the bias signal to be equal to the reference signal. Since the bias signal output of replica bias circuit 104 is provided to bias signal input 116 of amplifier circuit 102, and the bias signal is driven to be equal to the reference signal, amplifier circuit 102 and replica bias circuit 104 together produce the output signal in response to the input signal and the reference signal such that the output signal represents a difference between the input signal and the reference signal.

The illustration of FIG. 1 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in an illustrative embodiment, the bias signal output of a single replica bias circuit 104 may be connected to bias signal input 116 of a plurality of amplifier circuits 102. In this case, each of the plurality of amplifier circuits 102 produces an output signal in response to the input signal to the amplifier circuit 102 and the reference signal provided to the single replica bias circuit 104, such that the output signal of each amplifier circuit 102 represents a difference between the input signal and the reference signal.

Figure 2:
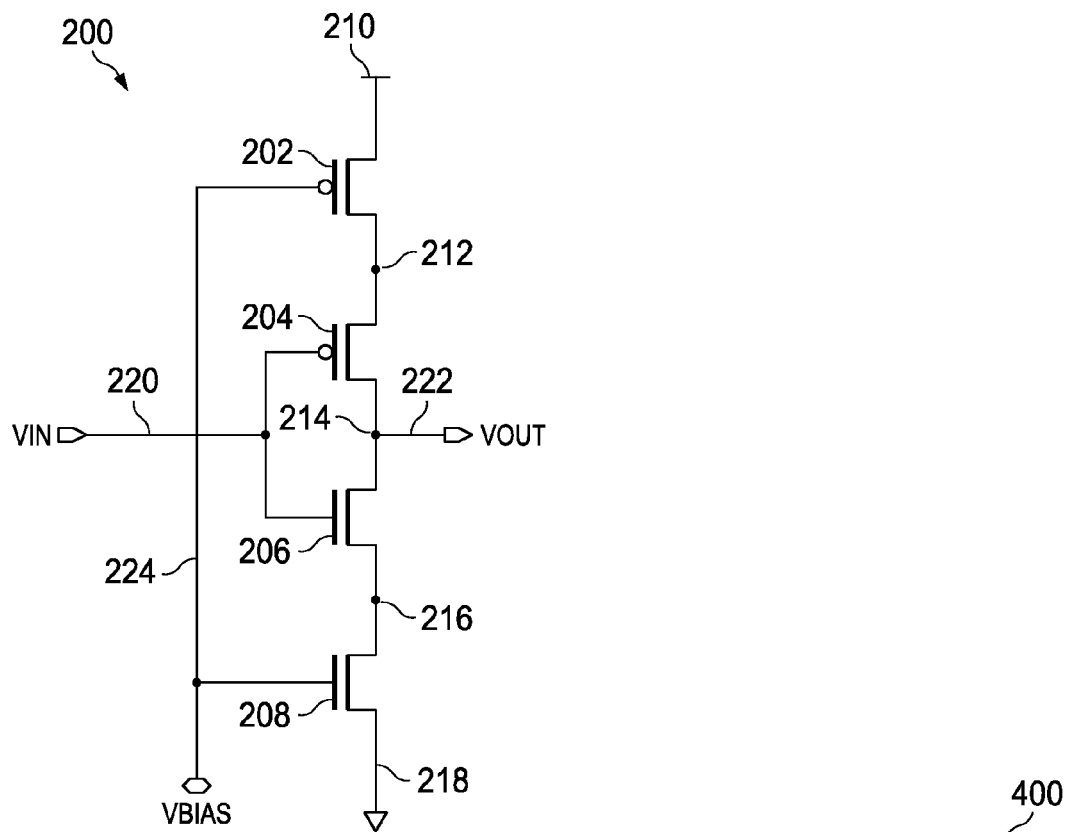
FIG. 2 is a circuit schematic of an exemplary amplifier circuit for use in an exemplary error amplifier in accordance with an illustrative embodiment.

A schematic circuit diagram showing in more detail an exemplary amplifier circuit 200 in accordance with an illustrative embodiment is presented in FIG. 2. In this example, amplifier circuit 200 is an example of one implementation of amplifier circuit 102 of FIG. 1.

In accordance with an illustrative embodiment, exemplary amplifier circuit 200 is implemented using complementary metal-oxide-semiconductor (CMOS) technology. Exemplary amplifier circuit 200 is comprised of four transistors 202, 204, 206, and 208. First transistor 202 is a p-type metal-oxide-semiconductor (PMOS) transistor having a source connected to supply voltage connection 210 and a drain connected to first connection point 212. Second transistor 204 is a PMOS transistor having a source connected to first connection point 212 and a drain connected to second connection point 214. Third transistor 206 is an n-type metal-oxide-semiconductor (NMOS) transistor having a drain connected to second connection point 214 and a source connected to third connection point 216. Fourth transistor 208 is an NMOS transistor having a drain connected to third connection point 216 and a source connected to ground connection 218.

Input signal input 220 is connected to a gate of second transistor 204 and to a gate of third transistor 206. Output signal output 222 is connected to second connection point 214. Bias signal input 224 is connected to a gate of first transistor 202 and to a gate of fourth transistor 208.

Second 204 and third 206 transistors together form a basic inverting CMOS amplifier. First 202 and fourth 208 transistors together control the reference threshold of the basic inverting CMOS amplifier in response to the bias signal provided on bias signal input 224 by replica bias circuit 104.

Figure 3:
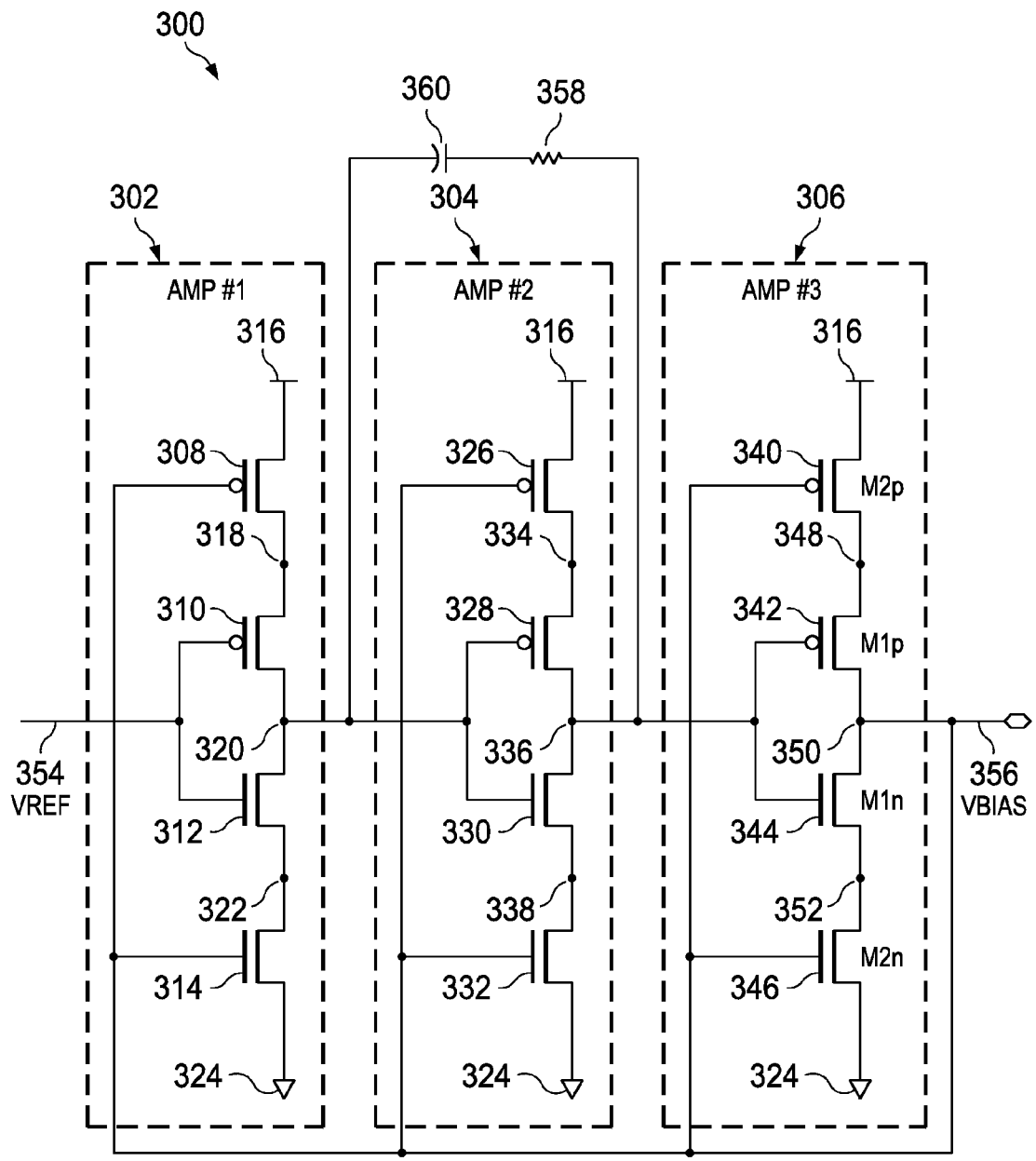
FIG. 3 is a circuit schematic of an exemplary replica bias circuit for use in an exemplary error amplifier in accordance with an illustrative embodiment.

A schematic circuit diagram showing in more detail an exemplary illustrative embodiment of a replica bias circuit 300 for providing a bias signal is presented in FIG. 3. In this example, replica bias circuit 300 is an example of one implementation of replica bias circuit 104 in FIG. 1.

In accordance with an illustrative embodiment, replica bias circuit 300 comprises three identical amplifier stages 302, 304, and 306 cascaded in series. Each amplifier stage 302, 304, and 306 may be implemented using CMOS technology. Preferably, the device sizes of devices forming amplifier stages 302, 304, and 306 match the device sizes of devices forming amplifier circuit 200 with which replica bias circuit 300 will be employed to implement an error amplifier in accordance with an illustrative embodiment.

In accordance with an illustrative embodiment, exemplary first amplifier stage 302 is comprised of four transistors 308, 310, 312, and 314. First transistor 308 is a PMOS transistor having a source connected to supply voltage connection 316 and a drain connected to first connection point 318. Second transistor 310 is a PMOS transistor having a source connected to first connection point 318 and a drain connected to second connection point 320. Third transistor 312 is an NMOS transistor having a drain connected to second connection point 320 and a source connected to third connection point 322. Fourth transistor 314 is an NMOS transistor having a drain connected to third connection point 322 and a source connected to ground connection 324.

Similarly, exemplary second amplifier stage 304 is comprised of four transistors 326, 328, 330, and 332. First transistor 326 is a PMOS transistor having a source connected to supply voltage connection 316 and a drain connected to first connection point 334. Second transistor 328 is a PMOS transistor having a source connected to first connection point 334 and a drain connected to second connection point 336. Third transistor 330 is an NMOS transistor having a drain connected to second connection point 336 and a source connected to third connection point 338. Fourth transistor 332 is an NMOS transistor having a drain connected to third connection point 338 and a source connected to ground connection 324.

Similarly, exemplary third amplifier stage 306 is comprised of four transistors 340, 342, 344, and 346. First transistor 340 is a PMOS transistor having a source connected to supply voltage connection 316 and a drain connected to first connection point 348. Second transistor 342 is a PMOS transistor having a source connected to first connection point 348 and a drain connected to second connection point 350. Third transistor 344 is an NMOS transistor having a drain connected to second connection point 350 and a source connected to third connection point 352. Fourth transistor 346 is an NMOS transistor having a drain connected to third connection point 352 and a source connected to ground connection 324.

Reference signal input 354 is connected to a gate of second transistor 310 of first amplifier stage 302 and to a gate of third transistor 312 of first amplifier stage 302. Connection point 320 of first amplifier stage 302 is connected to a gate of second transistor 328 of second amplifier stage 304 and to a gate of third transistor 330 of second amplifier stage 304. Second connection point 336 of second amplifier stage 304 is connected to a gate of second transistor 342 of third amplifier stage 306 and to a gate of third transistor 344 of third amplifier stage 306. Second connection point 350 of third amplifier stage 306 is connected to bias signal output 356.

Bias signal output 356 is connected to provide a feedback signal to amplifier stages 302, 304, and 306. Thus, bias signal output 356 is connected to gates of first 308 and fourth 314 transistors of first amplifier stage 302, to gates of first 326 and fourth 332 transistors of second amplifier stage 304, and to gates of first 340 and fourth 346 gates of third amplifier stage 306.

Resistor 358 and capacitor 360 may be connected in series between second connection point 320 of first amplifier stage 302 and second connection point 336 of second amplifier stage 304. Resistor 358 and capacitor 360 compensate amplifiers 302, 304, and 306 and ensure overall stability.

It can be seen that the input to first amplifier stage 302 is the desired reference signal. The reference threshold of first amplifier stage 302 is set by feedback of the bias signal from the bias signal output 356. If the reference threshold of first amplifier stage 302 is less than the reference signal then the output of first amplifier stage 302 decreases. This error voltage is further amplified by the second 304 and third 306 amplifier stages and fed back to the first amplifier stage 302 as feedback with a polarity so as to increase the reference threshold. Similarly, if the reference threshold of first amplifier stage 302 is greater than the reference signal then the output of first amplifier stage 302 increases and the feedback causes the reference threshold to decrease. The net effect is that the reference threshold of the amplifier stages 302, 304, and 306 is set equal to the reference signal. The bias signal on bias signal output 356 thus is driven to equal the reference signal on reference signal input 354. The bias signal is then used to implicitly set the reference of one or more replica amplifier circuits which can be used as error amplifiers.

Figure 4:
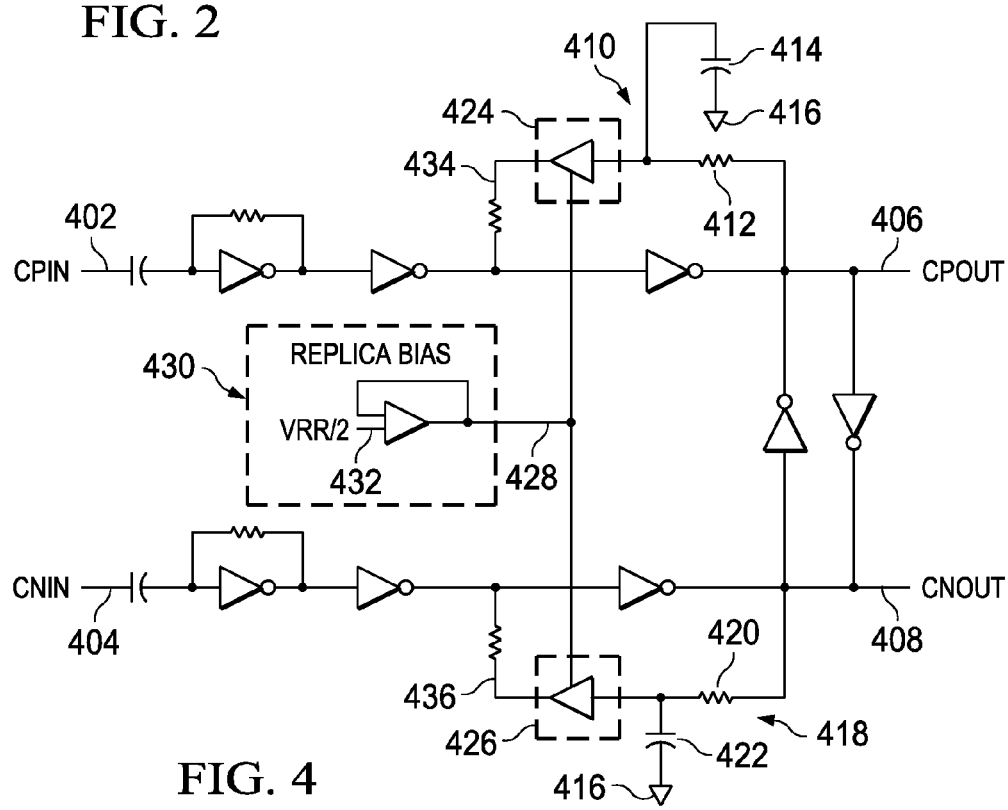
FIG. 4 is a circuit schematic of an exemplary duty cycle control loop circuit including an error amplifier in accordance with an illustrative embodiment, showing an exemplary application of an error amplifier in accordance with an illustrative embodiment.

A schematic circuit diagram of an exemplary duty cycle control loop 400 of a level-shifter is presented in FIG. 4. FIG. 4 illustrated one exemplary application of an error amplifier in accordance with an illustrative embodiment.

Control loop 400 receives input clock signals $CP_{in}$ and $CN_{in}$ on input lines 402 and 404. The input clock signals $CP_{in}$ and $CN_{in}$ on input lines 402 and 404 are capacitively level-shifted and amplified to CMOS levels. Control loop 400 provides output signals $CP_{out}$ and $CN_{out}$ on output lines 406 and 408. The average value of output signal $CP_{out}$ is measured by low pass filter 410 formed of resistor 412 and capacitor 414 connected between output line 406 and ground 416. Similarly, the average value of output signal $CN_{out}$ is measured by low pass filter 418 formed of resistor 420 and capacitor 422 connected between output line 408 and ground 416. The output of low pass filter 410 is connected to the input of amplifier circuit 424. The output of low pass filter 418 is connected to the input of amplifier circuit 426.

Each amplifier circuit 424 and 426 is implemented as an amplifier circuit in accordance with an illustrative embodiment, such as amplifier circuit 102 of FIG. 1 or amplifier circuit 200 of FIG. 2. A bias signal on line 428 is provided for each amplifier circuit 424 and 426 by replica bias circuit 430. Replica bias circuit 430 is implemented as a replica bias circuit in accordance with an illustrative embodiment, such as replica bias circuit 104 of FIG. 1 or replica bias circuit 300 of FIG. 3. Reference signal input 432 to replica bias circuit 430 is the mid-point of the supply voltage VRR/2. Thus, the bias signal provided on line 428 is driven by replica bias circuit 430 to equal the mid-point of the supply voltage. Each amplifier circuit 424 and 426 thus compares the average value of one of the output signals $CP_{out}$ and $CN_{out}$, respectively, to the mid-point of the supply voltage. The output of amplifier circuit 424 on line 434 thus represents a difference between the average value of output signal $CP_{out}$ on output line 406 and the mid-point of the supply voltage VRR/2. Similarly, the output of amplifier circuit 426 on line 436 represents a difference between the average value of output signal $CN_{out}$ on output line 408 and the mid-point of the supply voltage VRR/2.

Lines 434 and 436 are connected to feed the error amplifier output signals back to control the average of the output signals $CP_{out}$ and $CN_{out}$ to the mid-point of the supply voltage, which also controls the duty cycle.

Figure 5:
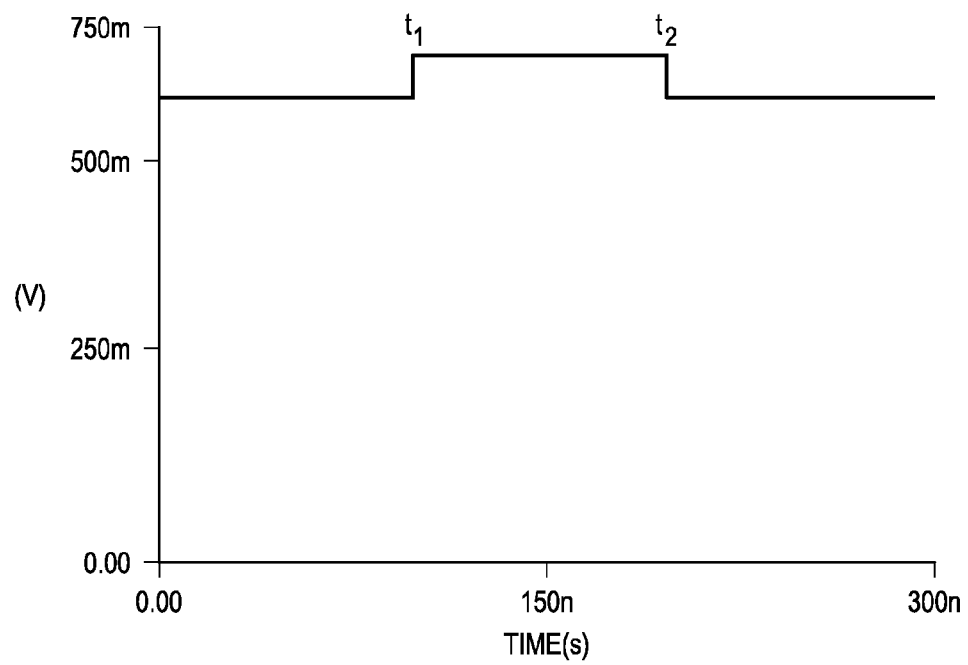
FIGS. 5-7 are waveform diagrams illustrating operation of an exemplary error amplifier in accordance with an illustrative embodiment operating in the exemplary application of FIG. 4.
Figure 6:
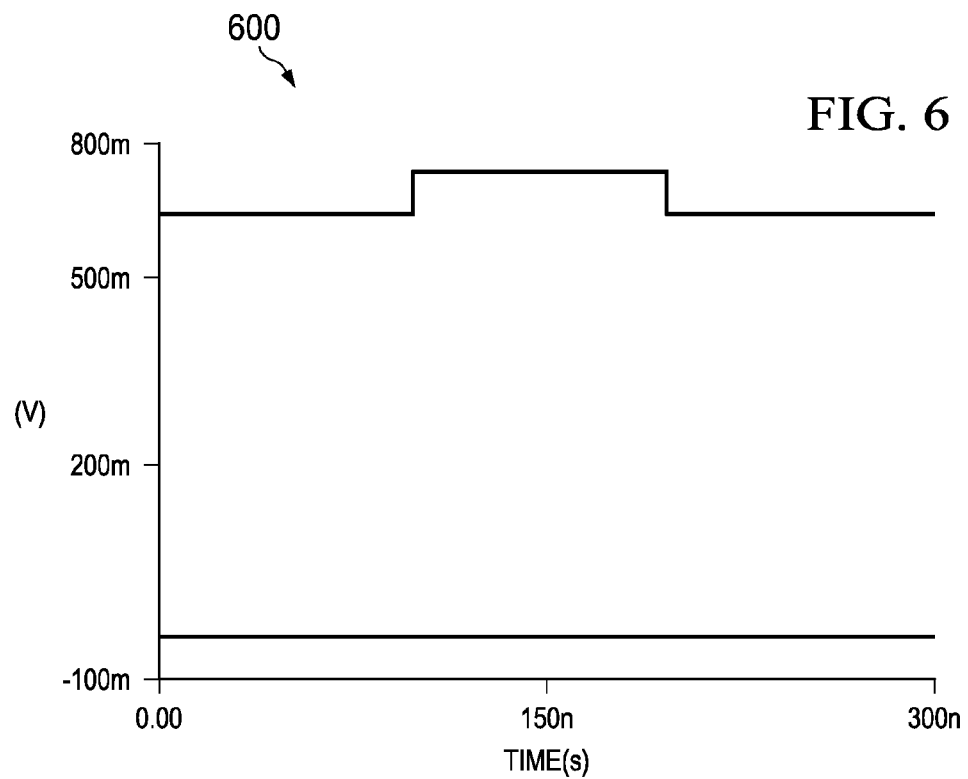
Figure 7:
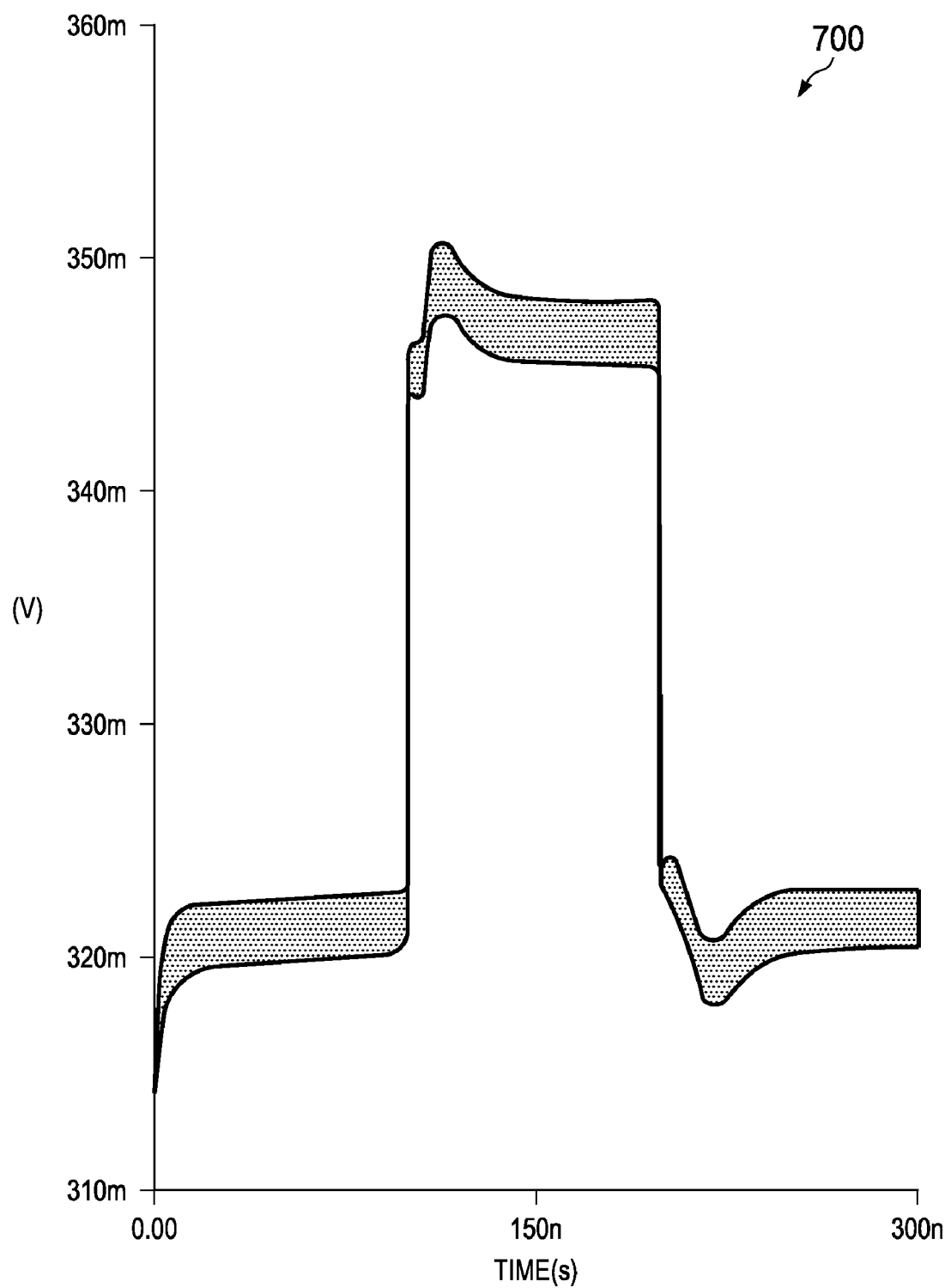

Operation of an exemplary error amplifier in accordance with an illustrative embodiment operating in the exemplary application of circuit 400 of FIG. 4 is illustrated by the waveform diagrams of FIGS. 5-7. Waveform 500 illustrated in FIG. 5 shows power supply voltage VRR with respect to time. The reference voltage VRR/2 provided on line 432 to exemplary replica bias circuit 430 in accordance with an illustrative embodiment is thus directly related to waveform 500. Waveform 600 illustrated in FIG. 6 shows the signal $CN_{out}$ on line 408 with respect to time and over the same time period as waveform 500 in FIG. 5. Thus, waveform 600 corresponds to the input signal to amplifier circuit 426 in accordance with an illustrative embodiment before passing through low pass filter 418. Waveform 700 illustrated in FIG. 7 shows the output signal on line 436, provided by amplifier circuit 426, with respect to time and over the same time period as waveform 500 in FIG. 5 and waveform 600 in FIG. 6. Waveforms 500, 600, and 700 were obtained by simulation of circuit 400.

At time $t_1$ the power supply voltage, waveform 500, is perturbed by increasing the supply voltage VRR by 50 mV. Thus, the reference voltage on line 432 to replica bias circuit 430 is increased at time $t_1$ by 25 mV. The output on line 436 of the error amplifier in accordance with an illustrative embodiment consisting of amplifier circuit 426 and replica bias circuit 430 responds to the change in the reference voltage at time $t_1$ as shown in waveform 700. This error amplifier output signal on line 426 is fed back to control the circuit output signal $CN_{out}$ on line 408, waveform 600, to the mid-point of the supply voltage VRR. Thus, waveform 600 shows an increase in $CN_{out}$ in response to the change in VRR at time $t_1$. Thus, the output of the error amplifier on line 426 responds to correct the output duty cycle in response to the perturbation in the supply voltage at time $t_1$. At time $t_2$ the perturbation to the supply voltage VRR is removed, and the output of the error amplifier on line 426 and signal $CN_{out}$ on line 408 return to their original values.

An error amplifier in accordance with an illustrative embodiment may be implemented for operation using circuit devices of any desired size and capacity for operation at any desired supply voltage level. However, an error amplifier in accordance with an illustrative embodiment is well suited for operation at low supply voltage levels, such as at supply voltage levels of 800 mV and below, using circuit devices appropriate for operation at such low supply voltage levels. At such supply voltage levels it may be difficult or impossible to implement an error amplifier in a conventional manner using a typical differential amplifier design. For example, an error amplifier in accordance with an illustrative embodiment was simulated in an exemplary application as illustrated in FIG. 4. This simulation indicated that good results could be achieved down to 0.6V, approximately twice the threshold voltage of the devices used, over process, temperature, and supply.

One or more of the illustrative embodiments thus provides an error amplifier that may be implemented at low supply voltages compatible with rail-to-rail CMOS circuits. Low-voltage CMOS technology has the potential to lower overall power dissipation in many applications. Thus, an error amplifier in accordance with an illustrative embodiment may be useful in serial input/output for storage, backplane, or communication applications, along with many others.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and explanation, but is not intended to exhaust or to limit the invention to the form disclosed. Many modifications and variations will be apparent to those of ordinary skill in the art without departing from the scope and spirit of the invention. The illustrative embodiments were chosen and described in order to best explain the principles of the invention and the practical application, and to enable others of ordinary skill in the art to understand the invention for various embodiments with various modifications as are suited to the particular use contemplated.

What is claimed is:

1. An analog error amplifier, comprising:
    an amplifier circuit including an input signal input, a bias signal input, and an output signal output, and wherein the amplifier circuit produces an output signal on the output signal output in response to an input signal on the input signal input and a bias signal on the bias signal input such that the output signal represents a difference between the input signal and the bias signal; and
    a replica bias circuit including a reference signal input and a bias signal output, wherein the replica bias circuit produces a bias signal on the bias signal output in response to a reference signal on the reference signal input and drives the bias signal to be equal to the reference signal; and
    wherein the bias signal output of the replica bias circuit is connected to the bias signal input of the amplifier circuit, such that the amplifier circuit and replica bias circuit together produce the output signal in response to the input signal and the reference signal such that the output signal represents a difference between the input signal and the reference signal.

2. The analog error amplifier of claim 1, wherein the amplifier circuit comprises:
    a basic amplifier connected to receive the input signal and to produce the output signal in response to the input signal; and
    wherein a reference threshold of the basic amplifier is responsive to the bias signal.

3. The analog error amplifier of claim 2, wherein the basic amplifier is an inverting complementary metal-oxide-semiconductor amplifier.

4. The analog error amplifier of claim 3, wherein the amplifier circuit comprises:
    a first p-type metal-oxide-semiconductor transistor having a source connected to a supply voltage connection and a drain connected to a first connection point;
    a second p-type metal-oxide-semiconductor transistor having a source connected to the first connection point and a drain connected to a second connection point;
    a first n-type metal-oxide-semiconductor transistor having a drain connected to the second connection point and a source connected to a third connection point;
    a second n-type metal-oxide-semiconductor transistor having a drain connected to the third connection point and a source connected to a ground connection;
    wherein the input signal input is connected to a gate of the second p-type metal-oxide-semiconductor transistor and to a gate of the first n-type metal-oxide-semiconductor transistor and the output signal output is connected to the second connection point such that the second p-type metal-oxide-semiconductor transistor and the first n-type metal-oxide-semiconductor transistor together form the inverting complementary metal-oxide-semiconductor amplifier; and
    wherein the bias signal input is connected to a gate of the first p-type metal-oxide-semiconductor transistor and to a gate of the second n-type metal-oxide-semiconductor transistor such that the first p-type metal-oxide-semiconductor transistor and the second n-type metal-oxide-semiconductor transistor together control the reference threshold of the inverting complementary metal-oxide-semiconductor amplifier in response to the bias signal.

5. The analog error amplifier of claim 1, wherein the replica bias circuit comprises:
    three amplifier stages cascaded in series between the reference signal input and the bias signal output.

6. The analog error amplifier of claim 5, wherein each of the three amplifier stages comprises a complementary metal-oxide-semiconductor amplifier.

7. The analog error amplifier of claim 6, wherein each of the three amplifier stages comprises:
    a first p-type metal-oxide-semiconductor transistor having a source connected to a supply voltage connection and a drain connected to a first connection point;
    a second p-type metal-oxide-semiconductor transistor having a source connected to the first connection point and a drain connected to a second connection point;
    a first n-type metal-oxide-semiconductor transistor having a drain connected to the second connection point and a source connected to a third connection point; and
    a second n-type metal-oxide-semiconductor transistor having a drain connected to the third connection point and a source connected to a ground connection.

8. The analog error amplifier of claim 7, wherein the replica bias circuit comprises:
    the reference signal input is connected to a gate of the second p-type metal-oxide-semiconductor transistor of a first amplifier stage and to a gate of the first n-type metal-oxide-semiconductor transistor of the first amplifier stage;
    the second connection point of the first amplifier stage is connected to a gate of the second p-type metal-oxide-semiconductor transistor of a second amplifier stage and to a gate of the first n-type metal-oxide-semiconductor transistor of the second amplifier stage;
    the second connection point of the second amplifier stage is connected to a gate of the second p-type metal-oxide-semiconductor transistor of a third amplifier stage and to a gate of the first n-type metal-oxide-semiconductor transistor of the third amplifier stage; and the bias signal output is connected to the second connection point of the third amplifier stage, to a gate of the first p-type metal-oxide-semiconductor transistor of the first amplifier stage, to a gate of the second n-type metal-oxide-semiconductor transistor of the first amplifier stage, to a gate of the first p-type metal-oxide-semiconductor transistor of the second amplifier stage, to a gate of the second n-type metal-oxide-semiconductor transistor of the second amplifier stage, to a gate of the first p-type metal-oxide-semiconductor transistor of the third amplifier stage, and to a gate of the second n-type metal-oxide-semiconductor transistor of the third amplifier stage.

9. The analog error amplifier of claim 8, wherein the replica bias circuit further comprises a capacitor and a resistor connected in series between the second connection point of the first amplifier stage and the second connection point of the second amplifier stage.

10. An analog error amplifier, comprising:
an amplifier circuit including an input signal input, a bias signal input, an output signal output, a basic amplifier connected to the input signal input to receive an input signal and to the output signal output, wherein the basic amplifier produces an output signal on the output signal output in response to the input signal on the input signal input, and wherein a reference threshold of the basic amplifier is responsive to a bias signal on the bias signal input, such that the output signal represents a difference between the input signal and the bias signal;
a replica bias circuit including a reference signal input, a bias signal output, a plurality of amplifier stages connected in series between the reference signal input and the bias signal output, and wherein the bias signal output is connected in a feedback loop to the plurality of amplifier stages, such that the replica bias circuit produces a bias signal on the bias signal output in response to a reference signal on the reference signal input and drives the bias signal to be equal to the reference signal; and
wherein the bias signal output of the replica bias circuit is connected to the bias signal input of the amplifier circuit such that the amplifier circuit and the replica bias circuit together produce the output signal in response to the input signal and the reference signal such that the output signal represents a difference between the input signal and the reference signal.

11. The analog error amplifier of claim 10, wherein:
the basic amplifier is an inverting complementary metal-oxide-semiconductor amplifier including p-type metal-oxide-semiconductor devices and n-type metal-oxide-semiconductor devices; and
each of the plurality of amplifier stages comprises a complementary metal-oxide-semiconductor amplifier including p-type metal-oxide-semiconductor devices and n-type metal-oxide-semiconductor devices.

12. The analog error amplifier of claim 11, wherein a size of the p-type metal-oxide-semiconductor devices and n-type metal-oxide-semiconductor devices in the amplifier circuit matches a size of the p-type metal-oxide-semiconductor devices and n-type metal-oxide-semiconductor devices in the replica bias circuit.

13. The analog error amplifier of claim 11, wherein the amplifier circuit comprises:
a first p-type metal-oxide-semiconductor transistor having a source connected to a supply voltage connection and a drain connected to a first connection point;
a second p-type metal-oxide-semiconductor transistor having a source connected to the first connection point and a drain connected to a second connection point;
a first n-type metal-oxide-semiconductor transistor having a drain connected to the second connection point and a source connected to a third connection point;
a second n-type metal-oxide-semiconductor transistor having a drain connected to the third connection point and a source connected to a ground connection;
wherein the input signal input is connected to a gate of the second p-type metal-oxide-semiconductor transistor and to a gate of the first n-type metal-oxide-semiconductor transistor and the output signal output is connected to the second connection point such that the second p-type metal-oxide-semiconductor transistor and the first n-type metal-oxide-semiconductor transistor together form the inverting complementary metal-oxide-semiconductor amplifier; and
wherein the bias signal input is connected to a gate of the first p-type metal-oxide-semiconductor transistor and to a gate of the second n-type metal-oxide-semiconductor transistor such that the first p-type metal-oxide-semiconductor transistor and the second n-type metal-oxide-semiconductor transistor together control the switching threshold of the inverting complementary metal-oxide-semiconductor amplifier in response to the bias signal.

14. The analog error amplifier of claim 11, wherein each of the amplifier stages comprises:
a first p-type metal-oxide-semiconductor transistor having a source connected to a supply voltage connection and a drain connected to a first connection point;
a second p-type metal-oxide-semiconductor transistor having a source connected to the first connection point and a drain connected to a second connection point;
a first n-type metal-oxide-semiconductor transistor having a drain connected to the second connection point and a source connected to a third connection point; and
a second n-type metal-oxide-semiconductor transistor having a drain connected to the third connection point and a source connected to a ground connection.

15. The analog error amplifier of claim 14, wherein the replica bias circuit comprises:
the reference signal input is connected to a gate of the second p-type metal-oxide-semiconductor transistor of a first amplifier stage and to a gate of the first n-type metal-oxide-semiconductor transistor of the first amplifier stage;
the second connection point of the first amplifier stage is connected to a gate of the second p-type metal-oxide-semiconductor transistor of a second amplifier stage and to a gate of the first n-type metal-oxide-semiconductor transistor of the second amplifier stage;
the second connection point of the second amplifier stage is connected to a gate of the second p-type metal-oxide-semiconductor transistor of a third amplifier stage and to a gate of the first n-type metal-oxide-semiconductor transistor of the third amplifier stage; and
the bias signal output is connected to the second connection point of the third amplifier stage, to a gate of the first p-type metal-oxide-semiconductor transistor of the first amplifier stage, to a gate of the second n-type metal-oxide-semiconductor transistor of the first amplifier stage, to a gate of the first p-type metal-oxide-semiconductor transistor of the second amplifier stage, to a gate of the second n-type metal-oxide-semiconductor transistor of the second amplifier stage, to a gate of the first p-type metal-oxide-semiconductor transistor of the third amplifier stage, and to a gate of the second n-type metal-oxide-semiconductor transistor of the third amplifier stage.

16. The analog error amplifier of claim 1, further comprising a plurality of amplifier circuits, wherein the bias signal input of each of the plurality of amplifier circuits is connected to the bias signal output of a single common replica bias circuit.

17. An analog error amplifier, comprising:
a plurality of amplifier circuits, wherein each of the plurality of amplifier circuits includes an input signal input, a bias signal input, and an output signal output, and wherein the amplifier circuit produces an output signal on the output signal output in response to an input signal on the input signal input and a bias signal on the bias signal input such that the output signal represents a difference between the input signal and the bias signal; and
a single replica bias circuit including a reference signal input and a bias signal output, wherein the replica bias circuit produces a bias signal on the bias signal output in response to a reference signal on the reference signal input and drives the bias signal to be equal to the reference signal; and
wherein the bias signal output of the single replica bias circuit is connected to the bias signal input of each of the plurality of amplifier circuits, such that each of the plurality of amplifier circuits produces an output signal in response to the input signal to the amplifier circuit and the reference signal to the single replica bias circuit such that the output signal represents a difference between the input signal and the reference signal.

18. The analog error amplifier of claim 17, wherein:
each of the plurality of amplifier circuits comprises a basic amplifier connected to receive an input signal and to produce an output signal in response to the input signal, and wherein a reference threshold of the basic amplifier is responsive to the bias signal; and
the replica bias circuit comprises a plurality of amplifier stages cascaded in series between the reference signal input and the bias signal output and wherein the bias signal output is connected in a feedback loop to the plurality of amplifier stages.

19. The analog error amplifier of claim 18, wherein:
the basic amplifier in each of the plurality of amplifier circuits is an inverting complementary metal-oxide-semiconductor amplifier including p-type metal-oxide-semiconductor devices and n-type metal-oxide-semiconductor devices; and
each of the plurality of amplifier stages comprises a complementary metal-oxide-semiconductor amplifier including p-type metal-oxide-semiconductor devices and n-type metal-oxide-semiconductor devices.

20. The analog error amplifier of claim 19, wherein a size of the p-type metal-oxide-semiconductor devices and n-type metal-oxide-semiconductor devices in each of the plurality of amplifier circuits matches a size of the p-type metal-oxide-semiconductor devices and n-type metal-oxide-semiconductor devices in the replica bias circuit.

* * * * *